US010141889B2

(12) United States Patent
Ogomi et al.

(10) Patent No.: US 10,141,889 B2
(45) Date of Patent: Nov. 27, 2018

(54) SEMICONDUCTOR INTEGRATED CIRCUIT, SENSOR READER, AND SENSOR READOUT METHOD

(71) Applicant: Mitsubishi Electric Corporation, Chiyoda-ku (JP)

(72) Inventors: Tomokazu Ogomi, Chiyoda-ku (JP); Takayuki Nakai, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/537,571

(22) PCT Filed: Apr. 25, 2016

(86) PCT No.: PCT/JP2016/062889
§ 371 (c)(1),
(2) Date: Jun. 19, 2017

(87) PCT Pub. No.: WO2017/187474
PCT Pub. Date: Nov. 2, 2017

(65) Prior Publication Data
US 2018/0198413 A1 Jul. 12, 2018

(51) Int. Cl.
*G01R 33/02* (2006.01)
*H03F 1/02* (2006.01)
(Continued)

(52) U.S. Cl.
CPC ....... *H03F 1/0211* (2013.01); *G01R 33/0023* (2013.01); *G01R 33/09* (2013.01);
(Continued)

(58) Field of Classification Search
CPC .... H03F 1/0211; G01R 33/0023; G01R 33/09
(Continued)

(56) References Cited

U.S. PATENT DOCUMENTS 5,869,999 A * 2/1999 Mawet ..................... G01D 5/12
324/676
5,982,232 A * 11/1999 Rogers ..................... H03F 3/087
330/308
(Continued)

FOREIGN PATENT DOCUMENTS

JP 59-154511 A 9/1984
JP 11-296245 A 10/1999
(Continued)

OTHER PUBLICATIONS

International Search Report dated Jul. 26, 2016 in PCT/JP2016/062889 filed Apr. 25, 2016(with Translation of Cited Documents in attached Foreign Language Search Report).

*Primary Examiner* — Reena Aurora
(74) *Attorney, Agent, or Firm* — Oblon, McClelland, Maier & Neustadt, L.L.P.

(57) ABSTRACT

In a sensor reader, an IC chip has a function for amplifying and outputting a sensor signal from each sensor element included in a sensor array, and includes a plurality of channel amplifiers connected each of the sensor elements. When an output switch is closed and the IC chip is in the outputting state, channel switches operate sequentially, and sensor amplification signals are output sequentially from the channel amplifiers. When the output switch is open and the IC chip is in the non-outputting state, a bias current of an operational amplifier of the channel amplifier is decreased, the IC chip is set to a low power consumption state, and gain of the operational amplifier is decreased.

16 Claims, 13 Drawing Sheets

(51) Int. Cl.
  *H03F 3/72* (2006.01)
  *H03G 3/30* (2006.01)
  *H03F 3/45* (2006.01)
  *G01R 33/09* (2006.01)
  *G01R 33/00* (2006.01)

(52) U.S. Cl.
  CPC ........... *H03F 3/45076* (2013.01); *H03F 3/72* (2013.01); *H03G 3/30* (2013.01); *H03F 2200/414* (2013.01); *H03F 2200/417* (2013.01); *H03F 2200/421* (2013.01); *H03F 2203/45276* (2013.01); *H03F 2203/45701* (2013.01)

(58) Field of Classification Search
  USPC ........................................................ 324/252
  See application file for complete search history.

(56) References Cited

U.S. PATENT DOCUMENTS

| | | |
|---|---|---|
| 6,163,206 A | 12/2000 | Kobayashi |
| 6,825,739 B2 * | 11/2004 | Fujimoto ............. H03H 19/004 327/554 |
| 7,403,065 B1 | 7/2008 | Gresham et al. |
| 2003/0058041 A1 | 3/2003 | Koizumi et al. |
| 2004/0132420 A1 | 7/2004 | Yoshizawa |
| 2014/0197828 A1 | 7/2014 | Kagano et al. |

FOREIGN PATENT DOCUMENTS

| | | |
|---|---|---|
| JP | 2002-124842 A | 4/2002 |
| JP | 2004-201044 A | 7/2004 |
| JP | 2013-38764 A | 2/2013 |

* cited by examiner

SEMICONDUCTOR INTEGRATED CIRCUIT, SENSOR READER, AND SENSOR READOUT METHOD

TECHNICAL FIELD

The present disclosure relates to a semiconductor integrated circuit, a sensor reader, and a sensor readout method that have a function for sequential readout of an electrical signal from a sensor array that includes a plurality of sensor elements.

BACKGROUND ART

Technology is used heretofore that reads out an image by use of a sensor array that includes a plurality of sensor elements arranged in a row. In a magnetic reader for reading magnetic information printed with magnetic ink on a medium such as paper, a magnetoresistive (MR) sensor is used as a sensor element that converts magnetism to electrical information. The reading out of the image is enabled by using a switch to sequentially select among outputs of channel amplifiers, each of the channel amplifiers being connected to a respective sensor element.

The electrical signal output from the sensor element in such a reader has very low amplitude. Thus the channel amplifier that amplifies such an electrical signal is required to increase the signal level with high gain, and in order to secure a high signal-to-noise ratio (SNR), is required to suppress the level of noise generated by the amplifier. Further, technology concerned with the channel amplifier is known that obtains a high SNR by subtracting a DC component from the output signal of the sensor element (for example, Patent Literature 1).

Here, the bias current of the channel amplifier is high in order to realize low noise. Since the required number of channel amplifiers is the same as the number of sensor elements, for example, if the bias current of the channel amplifier is taken to be 1 mA and the power supply voltage is taken to be 5 V, then in a device using 500 sensor elements, the consumed current reaches 500 mA, and the consumed power reaches 2.5 W. Thus problems occur in that costs increase due to the high capacity of the power source supplying power to the device, and in that, due to heat generated by the device, working life of components installed within the device decreases.

To solve such problems, technology is proposed that lowers average power consumption by performing control that sets to the operating state only the channel amplifier for which the switch connected to the output of the channel amplifier is in the conductive state (closed), and at other times sets the channel amplifier to a low power consumption state (for example, Patent Literature 2). This lowering of power consumption is described as being realizable by setting the voltage of the bias source of an operational amplifier included in the channel amplifier to a low value.

CITATION LIST

Patent Literature

Patent Literature 1: Unexamined Japanese Patent Application Kokai Publication No. 2013-38764
Patent Literature 2: Unexamined Japanese Patent Application Kokai Publication No. S59-154511

SUMMARY OF INVENTION

Technical Problem

When differential pair transistors are included in the input stage of the operational amplifier included in each of the channel amplifiers, an offset voltage, caused by differences in threshold voltages of the two transistors, is sometimes held between the non-inverted input terminal and the inverted input terminal of the operational amplifier. Normally, voltage of a voltage source connected to the non-inverted input terminal of the operational amplifier is adjusted so that this offset voltage becomes zero.

However, because the adjustment of the voltage of the voltage source is performed when the operational amplifier is in the operating state, the offset voltage of the operational amplifier in the low power consumption state changes from the offset voltage in the operating state, and as a result, the generated offset voltage is amplified by the large gain of the channel amplifier. Thus the offset voltage of the output stage has a value that exceeds the power supply voltage, and the operational amplifier outputs the same voltage as the power supply voltage (expressed hereinafter as voltage that "sticks at"). At this time, the state of the transistors within the operational amplifier is abnormal, such as in the off state or unsaturated state.

When the channel amplifier is controlled in the operating state after such an abnormal state, a time period is required until the turned-off transistor again is turned on, and the response time of the channel amplifier increases. Because this results in exceeding of the request for convergence time needed for scanning, a response is required such as lowering frequency of the clock, and there may be a problem of lowering of operating speed.

The present disclosure is developed in consideration of the aforementioned circumstances, and the objective of the present disclosure is to provide a semiconductor integrated circuit capable of realization of low power consumption without the lowering of operating speed.

Solution to Problem

In order to attain the aforementioned objective, the semiconductor integrated circuit of the present disclosure includes:

a plurality of first amplifiers, each first amplifier of the plurality of first amplifiers amplifying a sensor signal input from a sensor element of a plurality of sensor elements;

a plurality of first switches, each first switch of the plurality of first switches being connected to an output of each first amplifier to perform switching between conducting and blocking of the output;

a second switch to perform switching of a sensor amplification signal output via the first switch from the first amplifier, the switching of the second switch being between closing to conduct, and opening to block, to an external output terminal.

Further, the semiconductor integrated circuit further includes a control circuit to cause:

when the second switch is closed, operating of the first switches so that the sensor amplification signals output from the plurality of first amplifiers are output sequentially one at a time; and when the second switch is open, setting a bias current and a gain of at least one first amplifier of the plurality of first amplifiers to second setting values that are lower than first setting values, the first setting values being the bias current and the gain when the second switch is closed.

Advantageous Effects of Invention

According to the present disclosure, low power consumption can be realized without the lowering of operating speed.

DESCRIPTION OF EMBODIMENTS

Embodiment 1

Figure 1:
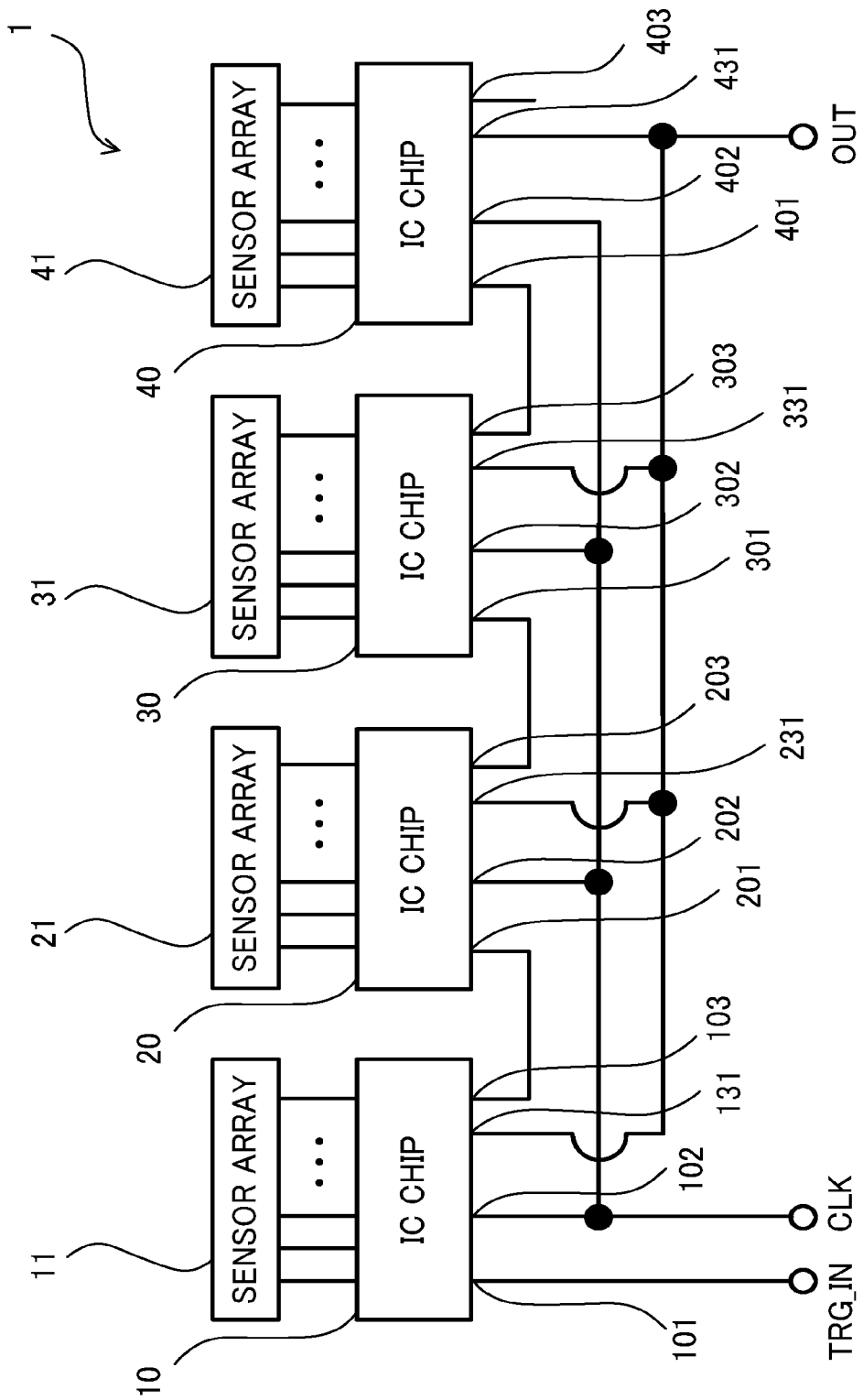
FIG. 1 is a block diagram illustrating a configuration of a sensor reader according to Embodiment 1.

FIG. 1 illustrates a configuration of a sensor reader 1 according to Embodiment 1 of the present disclosure. As illustrated in FIG. 1, the sensor reader 1 includes sensor arrays 11, 21, 31, and 41, in each of which a row of sensor elements is arranged, and includes semiconductor integrated circuit (IC) chips 10, 20, 30, and 40 that have a function for amplifying and outputting sensor signals output from each of the sensor elements. The IC chips 10, 20, 30, and 40 are synchronized with an externally supplied clock signal, and after a predetermined delay time is passed from input of a trigger signal, select and output sequentially the sensor amplification signals obtained by amplifying the sensor signals output from each of the sensor arrays.

Each of the sensor arrays 11, 21, 31, and 41 has n sensor elements. Each of the sensor elements included in the sensor array 11, 21, 31, and 41 is a freely-selected element that detects freely-selected information, and each of the sensor elements has mutually-equivalent performance. In the present embodiment, a case is described in which each sensor element detects magnetic information printed by magnetic ink on a medium such as paper, and each sensor element includes a magnetoresistive (MR) sensor that converts the magnetic information into electrical information.

The IC chip 10, 20, 30, and 40 amplifies and sequentially outputs electrical signals output from n (n is an integer greater than or equal to 2) sensor elements per sensor array 11, 21, 31, and 41, respectively. The IC chip 10 has a trigger input terminal 101, a clock input terminal 102, a trigger output terminal 103, and a signal output terminal 131; the IC chip 20 has a trigger input terminal 201, a clock input terminal 202, a trigger output terminal 203, and a signal output terminal 231; the IC chip 30 has a trigger input terminal 301, a clock input terminal 302, a trigger output terminal 303, and a signal output terminal 331; and the IC chip 40 has a trigger input terminal 401, a clock input terminal 402, a trigger output terminal 403, and a signal output terminal 431.

A trigger input signal (TRG_IN) from the exterior is input to the trigger input terminal 101 of the IC chip 10. A trigger output signal (TRG_OUT) output by the trigger output terminal 103 of the IC chip 10 is input to the trigger input terminal 201 of the IC chip 20; the trigger output signal (TRG_OUT) output by the trigger output terminal 203 of the IC chip 20 is input to the trigger input terminal 301 of the IC chip 30; and the trigger output signal (TRG_OUT) output by the trigger output terminal 303 of the IC chip 30 is input to the trigger input terminal 401 of the IC chip 40. Further, the trigger output terminal 403 of the IC chip 40 is unconnected, and this terminal may be terminated within the chip or externally.

The clock input terminal 102 of the IC chip 10, the clock input terminal 202 of the IC chip 20, the clock input terminal 302 of the IC chip 30, and the clock input terminal 402 of the IC chip 40 are mutually short-circuited and receive input of a clock signal (CLK) from the exterior. Further, the signal output terminals 131, 231, 331, 431 are mutually short-circuited and output an output signal (OUT).

Figure 2:
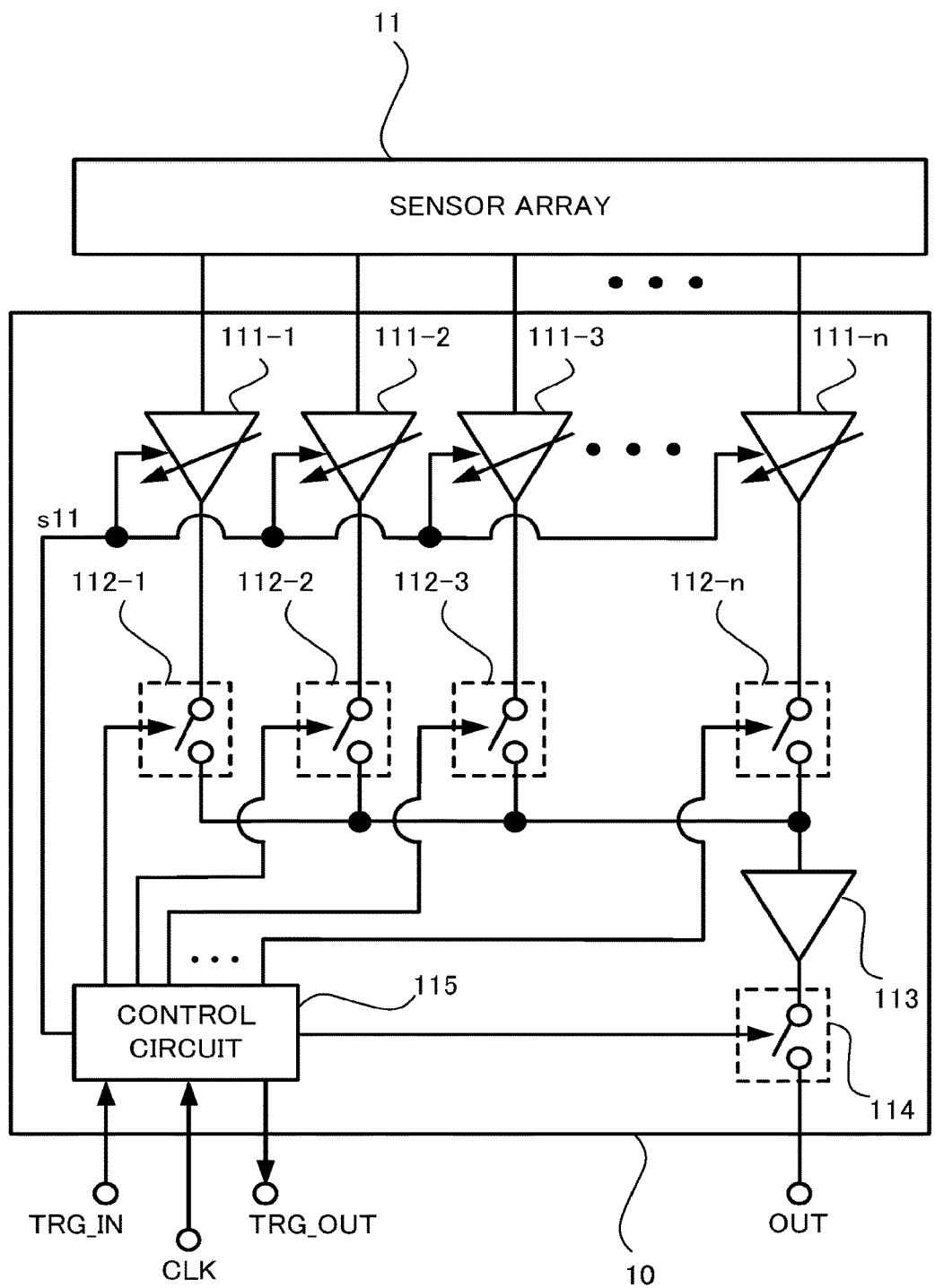
FIG. 2 is a drawing illustrating an internal configuration of an IC chip according to Embodiment 1.

The IC chips 10, 20, 30, and 40 each have the same configuration. FIG. 2 is a drawing illustrating the internal configuration of the IC chip 10. The IC chip 10 is described below in detail. As illustrated in FIG. 2, the IC chip 10 includes n channel amplifiers 111 for receiving and amplifying at a prescribed gain each electrical signal (sensor signal) output from each of the n sensor elements of the sensor array 11, and n channel switches 112 that conduct or block the output signals (sensor amplification signals) of the channel amplifiers. A channel amplifier 111-$p$ and a channel switch 112-$p$ are connected, in order, to a p-th sensor element ($p$ is an integer ranging from 1 to n) among the n sensor elements of the sensor array 11.

Further, the IC chips 10, 20, 30, and 40 have an output amp 113 that amplifies and outputs one of the sensor amplification signals acquired via the channel switch 112 from the n channel amplifiers 111, and have an output switch 114 that conducts or blocks an output of the output amp 113.

Further, the IC chips 10, 20, 30, and 40 have a control circuit 115 that controls the channel amplifiers 111-1-$n$, the channel switches 112-1-$n$, and the output switch 113 on the basis of the input clock signal (CLK) and the trigger input signal (TRG_IN) and outputs a trigger output signal (TRG_OUT). The same control signal s11 is input to the channel amplifiers 111-1-$n$ from the control circuit 115.

The channel amplifier 111 is noise-reduced in order to amplify the weak signal from the sensor element, and thus the bias current is high. The required number of channel amplifiers 111 is the same as the number of sensor elements, and thus power consumption is quite high due to the large number of sensor elements. Here, control is performed such that the channel amplifier 111 is set to an operating state only when the output switch 114 is closed (conducting), and at other times, is set to a low power consumption state, thereby decreasing average power consumption.

Figure 3:
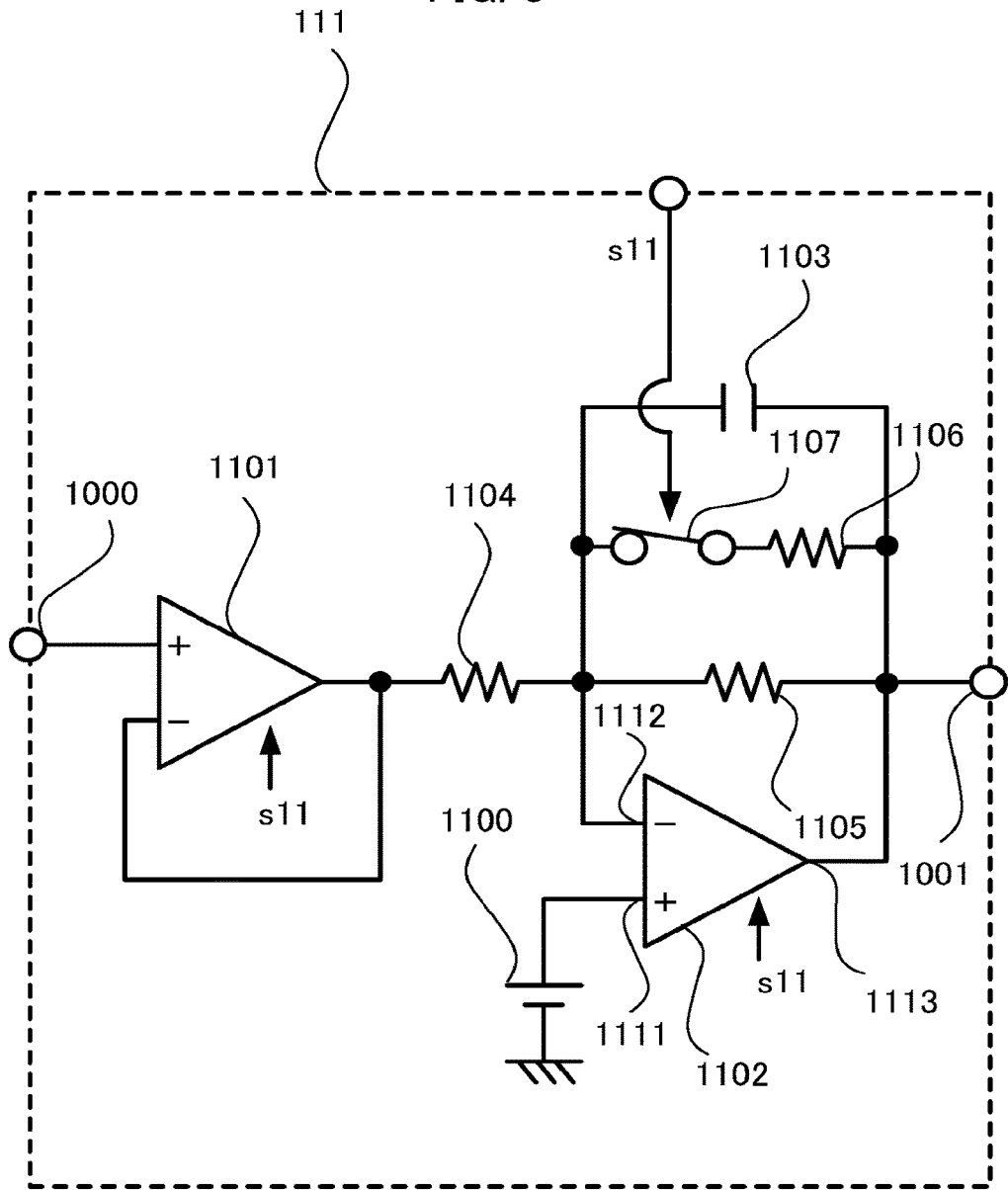
FIG. 3 is a drawing illustrating a circuit configuration of a channel amplifier according to Embodiment 1.

FIG. 3 is a drawing illustrating a circuit configuration of the channel amplifier 111. The channel amplifier 111 is provided with LPF properties for noise reduction. Thus as illustrated in FIG. 3, the channel amplifier 111 has a configuration that connects together a voltage-follower amp that includes a pre-stage operational amplifier 1101, a resistance 1104, and an inverting amplifier that includes a post-stage operational amplifier 1102.

Between an inverted input terminal 1112 and an output terminal 1113 of the operational amplifier 1102 included in the inverting amplifier, a capacitor 1103, a resistance 1105, and a series-connected resistance 1106 and switch 1107 are interconnected in parallel. Although the gain of the inverting amplifier is determined by the value of the resistance 1105, in this configuration, the resistance 1106 lowers the gain when the switch 1107 is closed.

The control signal s11 input to all the channel amplifiers 111-1-$n$ from the control circuit 115 is input to the operational amplifiers 1101, 1102 and the switch 1107. The control signal s11 is a signal that is switched according to whether the IC chip 10 is in the low power consumption state.

Figure 4:
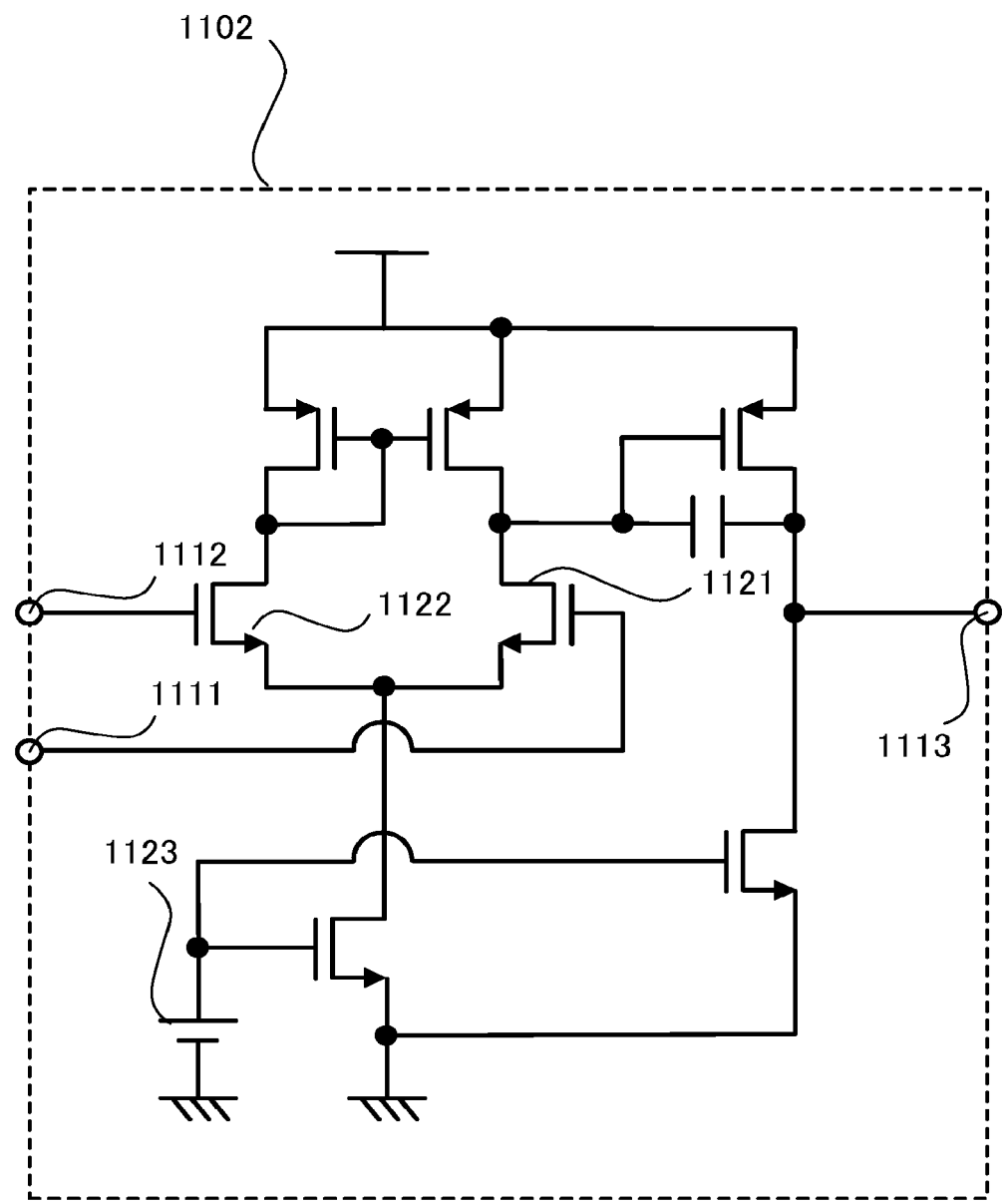
FIG. 4 is a drawing illustrating a circuit configuration of an operational amplifier.

FIG. 4 illustrates a circuit configuration example of the operational amplifier 1102 included in the inverting amplifier. In the case of use of the operational amplifier 1102 of FIG. 4, setting the voltage of a bias source 1123 to a lower value relative to the operating state enables lowering of the bias current and enables setting to the low power consumption state.

Between the non-inverted input terminal 1111 and the inverted input terminal 1112, the operational amplifier 1102 holds an offset voltage $\Delta Vi$ that is mainly caused by deviations in threshold voltages of a differential pair of transistors 1121, 1122. Voltage value of the voltage source 1100 applied to the non-inverted input terminal 1111 of the operational amplifier 1102 is adjusted so that the voltage of an output terminal 1001 of the channel amplifier 111 has a value (referred to hereinafter as the "common voltage") of a predetermined range. In order to cancel the offset voltage, the voltage of the voltage source 1100 has a value that deviates from the common voltage by $-\Delta Vi$.

Here, the effect imparted to the output voltage of the channel amplifier 111 by the offset voltage $\Delta Vi$ of the operational amplifier 1102, when the switch 1107 is open (blocked) and the gain is high, is described below. In the description below, R1104 is the resistance value of the resistance 1104, R1105 is the resistance value of the resistance 1105, and C1103 is the capacitance of the capacitor 1103.

Firstly, a voltage gain Av as viewed from an input terminal 1000 to the output terminal 1001 of the channel amplifier 111 is indicated by the following formula.

$$Av = R1105/R1104 \quad (1)$$

Further, a cutoff frequency fc and a time constant $\tau$ of the channel amplifier 111 are indicated by the following formulae.

$$fc = 1/(2\pi \cdot R1105 \cdot C1103) \quad (2)$$

$$\tau = R1105 \cdot C1103 \quad (3)$$

Here, the gains of the operational amplifier 1101 and the operational amplifier 1102 included in the channel amplifier 111 are assumed here to be sufficiently high relative to the gain Av of the channel amplifier 111, and the gain bandwidth (GB) product is assumed to be sufficiently high relative to fc.

Further, a voltage gain Avos as viewed from the voltage source 1100 through the output terminal 1001 of the channel amplifier 111 is indicated by the following formula.

$$Avos = (R1104 + R1105)/R1104 \quad (4)$$

The voltage gain Avos is expressed by the following formula, on the basis of the Formulae (1) and (4).

$$Avos = 1 + Av \quad (5)$$

When the switch 1107 is open, the gain of the output voltage of the channel amplifier 111 relative to the offset $\Delta Vi$ of the operational amplifier 1102 is equal to that of Formula (5), and thus the offset voltage $\Delta Vo$ observed at the output terminal 1001 of the channel amplifier 111 is indicated by the following formula.

$$\Delta Vo = Avos \cdot \Delta Vi \quad (6)$$

The value of Av of the channel amplifier 111 is set to about 100 so that the weak sensor signal output from the sensor element can be processed by an analog to digital converter (ADC) connected to the output of the IC chip 10. At this time, Avos is 101, and for example, in the case of $\Delta Vi = 10$ mV, $\Delta Vo$ is 1.01 V.

Here, the voltage of the voltage source 1100 is adjusted so that the offset voltage $\Delta Vi$ of the operational amplifier 1102 in the operating state of the channel amplifier 111 is zero.

Further, in order to lower overall power consumption of the IC chip 10, the channel amplifier 111 is set to the operating state when the output switch 114 is closed, and the channel amplifier 111 is set to the low power consumption state when the output switch 114 is open and in the non-outputting state.

Upon lowering of the bias currents of the operational amplifiers 1101, 1102 and setting to the low power consumption state, the offset voltages of the operational amplifiers 1101, 1102 vary relative to the voltages of the operating state, and as a result, the output voltage of the channel amplifier 111 has an offset.

Here, for simplification of the description, assuming that only the operational amplifier 1102 has an offset and that the offset voltage $\Delta Vi$ of the operational amplifier 1102 in this low power consumption state varies about 10 mV relative to in the operating state, the offset voltage $\Delta Vo$ in the output of the channel amplifier 111 reaches 1.01 V per Formula (6).

When the power supply voltage of the operational amplifier 1102 is taken to be 1.8 V and the common voltage VCOM is taken to be 0.9 V, the output voltage Vout of the channel amplifier 111 is expressed by the formula below.

$$Vout = VCOM + \Delta Vo = 1.91 \, [V] \quad (7)$$

The value of Vout exceeds the power supply voltage of 1.8 V. Because such a value cannot be actually output, the operational amplifier 1102 outputs ("sticks" at) the power supply voltage. At this time, the bias of the operational amplifier 1102 is in an abnormal state, such as when the internal transistors are turned off or in the unsaturated state.

When the channel amplifier 111 is controlled in the operating state after this abnormal state, a problem arises in that time is required until the turned-off transistors are again turned on, the response time of the channel amplifier 111 increases, and the response time may exceed the requested convergence time required for scanning of the channel amplifier 111.

In the present embodiment, in order to solve such a problem, a gain control function is provided for the channel amplifier 111, and in the low power consumption state, control is performed at a gain that is lower than that of the operating state. Specifically, in the inverting amplifier including the operational amplifier 1102, the series-connected switch 1107 and resistance 1106 are connected in parallel to the resistance 1105 that is a feedback resistance.

The switch 1107 is set open during the operating state of the channel amplifier 111, and the switch 1107 is set closed during the low power consumption state. By this means, in the low power consumption state, current flows in the resistance 1106 so that the combined resistance of the resistance 1105 and the resistance 1106 decreases, and thus the gain of the inverting amplifier including the operational amplifier 1102 is lowered.

In the low power consumption state, that is to say, when the switch 1107 is closed, the voltage gain Avstb of the channel amplifier 111 is expressed by the following formula.

$$Avstb = Rfb/R1104 \quad (8)$$

In Formula (8), Rfb indicates the combined resistance in the case of parallel connection of R1105 and R1106. For example, when R1106 is taken to be equal to R1104, Avstb in Formula (8) is nearly 1. When the offset voltage $\Delta Vi$ of the operational amplifier 1102 is taken to be 10 mV as in the above calculation, the output voltage offset $\Delta Vo$ of the channel amplifier 111 that occurs due to $\Delta Vi$ is as indicated below.

$$\Delta Vo \approx 2 \cdot \Delta Vi = 20 \text{ mV} \quad (9)$$

That is to say, even in the low power consumption state, there is no abnormal state of the channel amplifier output, such as during "sticking". Thus control is possible in the low power consumption state without the lowering of operating speed, and this enables lowering of the power consumption of the sensor reader 1.

Figure 5:
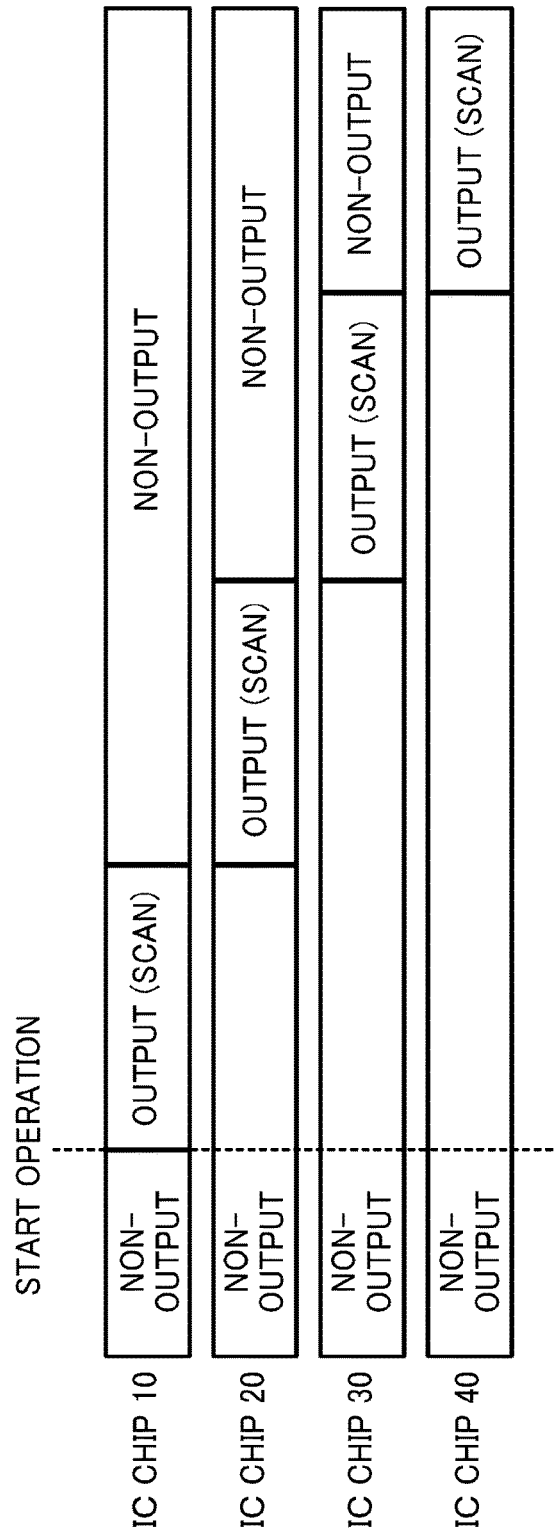
FIG. 5 is an operating sequence of the sensor reader according to Embodiment 1.

An operating sequence of the sensor reader 1 configured in the above-described manner is illustrated in FIG. 5. Taking the origin point of the operating sequence to be determined by the trigger input signal (TRG_IN), scanning and output are performed through the IC chip 10, and then sequentially, scanning and output are performed through the IC chip 20, the IC chip 30, and the IC chip 40. The signal output terminal 131 of the IC chip 10 is controlled in the outputting (on) state only in the time period during which the IC chip 10 is scanning, the signal output terminal 231 of the IC chip 20 is controlled in the outputting (on) state only in the time period during which the IC chip 20 is scanning, the signal output terminal 331 of the IC chip 30 is controlled in the outputting (on) state only in the time period during which the IC chip 30 is scanning, the signal output terminal 431 of the IC chip 40 is controlled in the outputting (on) state only in the time period during which the IC chip 40 is scanning, and control is performed in the non-outputting (off) state at other times.

Figure 6:
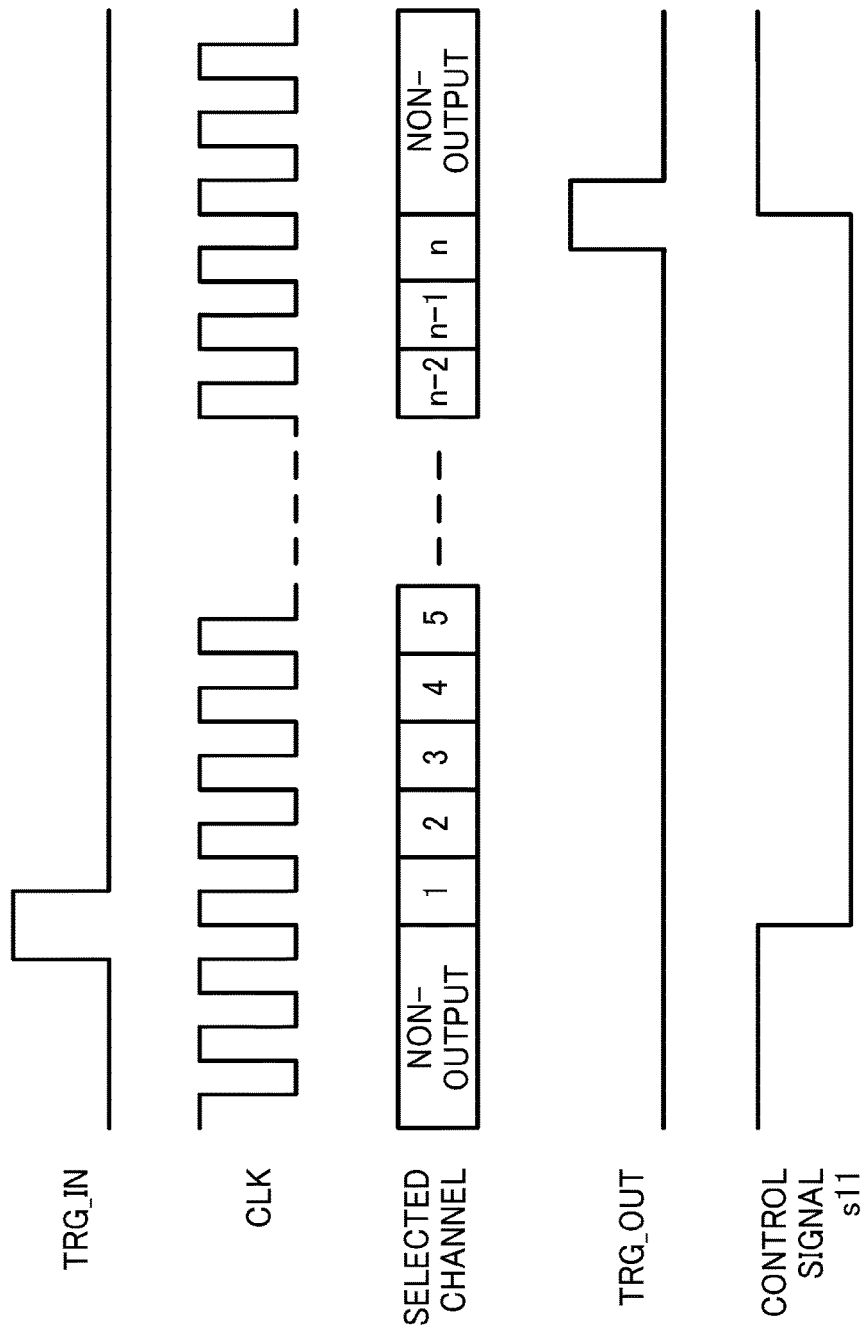
FIG. 6 is a timing chart of the IC chip according to Embodiment 1.

FIG. 6 is a timing chart of the IC chip 10. The IC chip 10 achieves the operating sequence of the sensor reader 1 illustrated in FIG. 5 by operating with the timing illustrated in FIG. 6. Operation of the IC chip 10 is synchronized with the rise-up of the clock signal (CLK). The control circuit 115 sets the IC 10 to the outputting state by closing of the output switch 114 at the timing of rise-up of the clock signal (CLK) while the trigger input signal (TRG_IN) is at the high level, and the channel switch 112-1 is simultaneously closed. Thereafter, at the timing of the next rise-up of the clock signal, the channel switch 112-1 is opened, and the channel switch 112-2 is closed. In the same manner, at the timing of the next rise-up of the clock signal, the channel switch 112-2 is opened, and the channel switch 112-3 is closed, the channel switches 112-3, . . . , 112-n are sequentially switched closed and opened, and data of the 2nd to n-th channels is sequentially output.

The output switch 114 is controlled to be closed and in the outputting state during the time period in which any of the channel switches 112-1-n is closed, and at other times, to be opened and in the non-outputting state. Further, the control circuit 115 generates and outputs the trigger output signal (TRG_OUT) for input to the next IC chip 20. The trigger output signal (TRG_OUT) output from the trigger output terminal 103 is input as the trigger input signal (TRG_IN) to the trigger input terminal 201 of the IC chip 20.

When the output switch 114 is closed and in the outputting state, the control signal s11 output from the control circuit 115 is at the low level. The channel amplifier 111 receives this control signal s11, sets the bias currents of the operational amplifiers 1101, 1102 to the setting values of the normal operating state, opens the switch 1107, and sets the gain of the operational amplifier 1102 to the setting value of the operating state.

When the output switch 114 is open and in the non-outputting state, the control signal s11 output from the control circuit 115 is at the high level. Upon reception of this control signal s11, the channel amplifier 111 lowers the bias current of the channel amplifier 111 to the setting value of the low power consumption state, closes the switch 1107, and lowers the gain of the operational amplifier 1102 to the setting value of the low power consumption state.

The IC chips 20, 30, 40 perform scanning similarly to that of the IC chip 10, and sequentially output data.

In the aforementioned manner, according to the sensor reader 1 of the present embodiment, when the IC chip 10 that has the function for amplifying and outputting the signal from each of the sensor elements is in the non-outputting state, the channel amplifier 111, amplifying the sensor signal output from one of the sensor elements, lowers the bias currents of the operational amplifiers 1101, 1102 for setting to the low power consumption state, and lowers the gain of the operational amplifier 1102. By this means, due to the lack of occurrence of abnormalities that are caused by offset voltage of the operational amplifiers 1101, 1102, in the non-outputting state, power consumption can be lowered without lowering operating speed in the outputting state.

Embodiment 2

Figure 7:
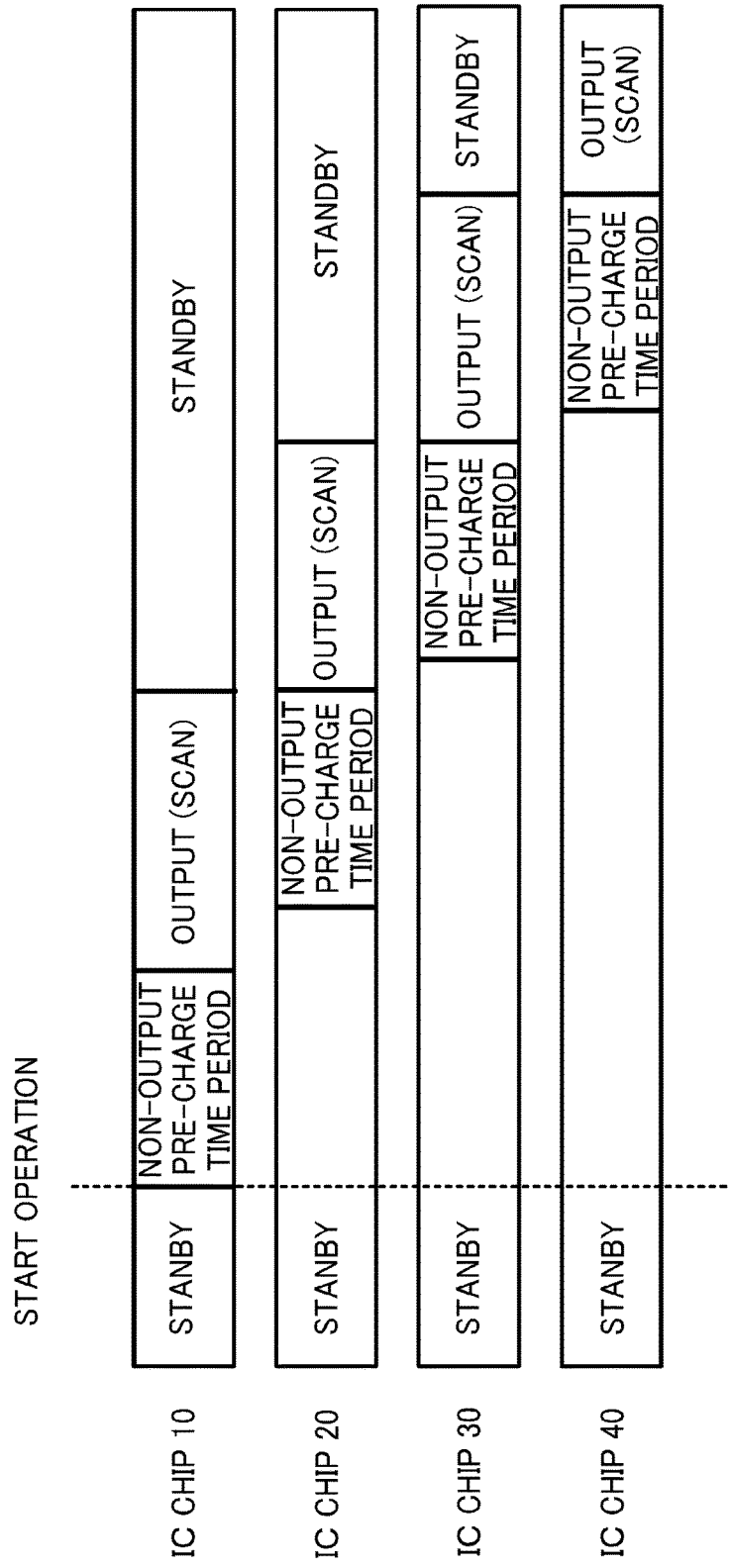
FIG. 7 is an operating sequence of a sensor reader according to Embodiment 2.
Figure 8:
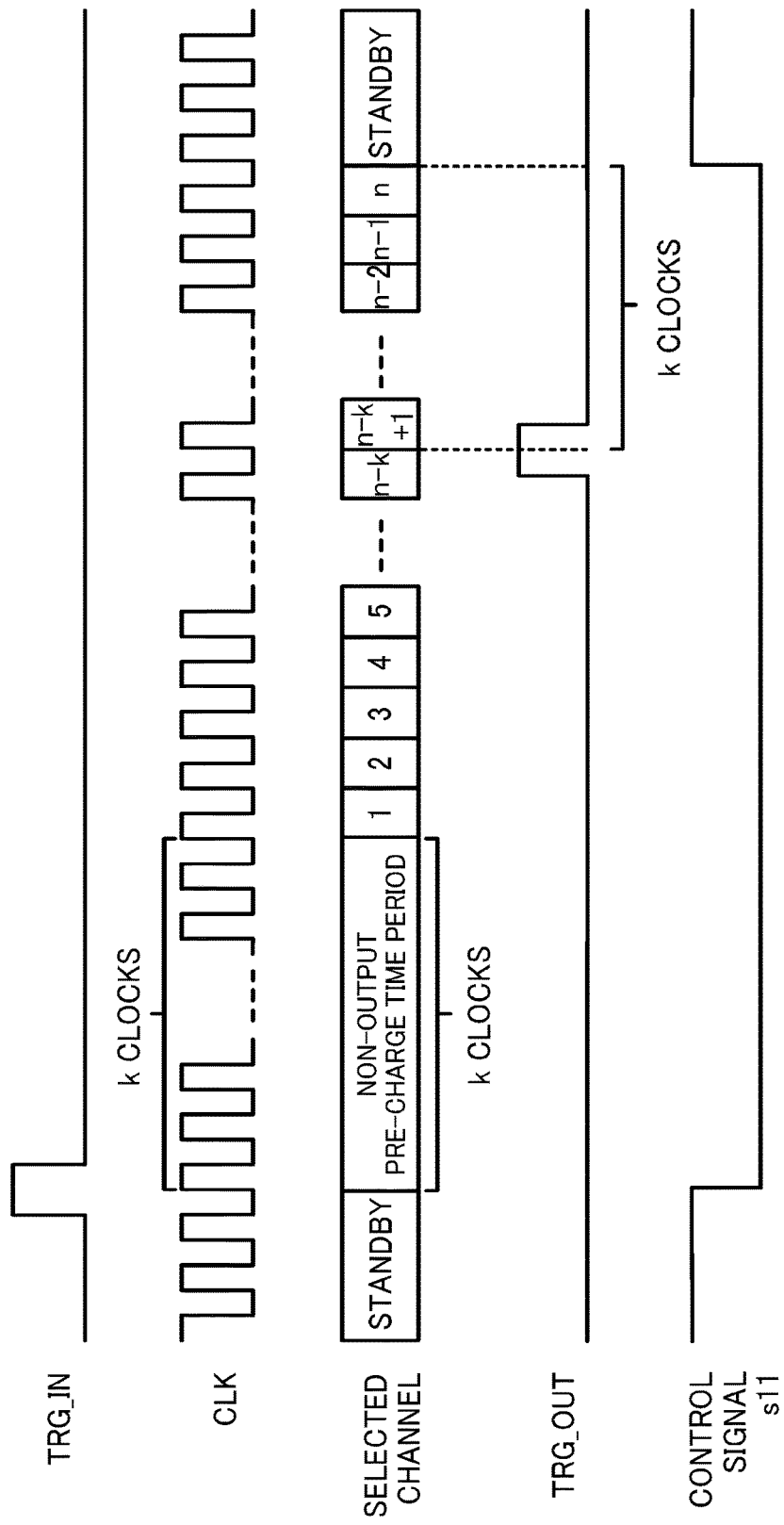
FIG. 8 is a timing chart of an IC chip according to Embodiment 2.

The configuration of the sensor reader 1 and the internal configuration of the IC chips 10, 20, 30, and 40 in Embodiment 2 of the present disclosure are similar to the configurations of Embodiment 1. The processing used by the sensor reader 1, such as the timing of data output, differs from that of Embodiment 1, and thus the processing is described in detail by use of FIGS. 7 and 8. FIG. 7 is an operating sequence of the sensor reader 1 according to the present embodiment, and FIG. 8 is a timing chart of the IC chip 10.

From the origin point of the operating sequence determined by the trigger input signal (TRG_IN), firstly the IC chip 10 is set to the operating state. Specifically, as illustrated in FIG. 8, the control circuit 115 of the IC chip 10 sets the control signal s11 to the low level when the trigger input signal (TRG_IN) is at the high level and after the timing of the rise-up of the clock signal (CLK). The channel amplifier 111 receives this control signal s11, sets the bias currents of the operational amplifiers 1101, 1102 to the setting values of the operating state, opens the switch 1107, and sets the gain of the operational amplifier 1102 to the setting value of the operating state.

A time period of k clocks after the timing of the rise-up of the clock (CLK) while the trigger input signal (TRG_IN) is at the high level is a non-outputting pre-charge time period for waiting to set the circuits of the IC chip 10 to the operating state and allow convergence of the circuits.

Then after passage of a fixed time period of k clocks, simultaneously with closing of the output switch 114 and setting of the IC chip 10 to the outputting state, the control circuit 115 closes the channel switch 112-1. Then at the timing of the next rise-up of the clock signal, the channel switch 112-1 is opened, and the channel switch 112-2 is closed. At the next rise-up timing of the clock signal, in the same manner, the switch 112-2 is opened, and the switch 112-3 is closed, the switches 112-3, . . . , 112-n are opened and closed in sequence, and data of the 2nd-n-th channels is output.

At the time at which data output finishes, the output switch 114 is open and is in the non-outputting state. At this timing, the control signal s11 output from the control circuit 115 is changed to the high level. Upon receiving this control signal s11, the channel amplifier 111 lowers the bias currents of the operational amplifiers 1101, 1102 to the setting values of the low power consumption state, closes the switch 1107, and lowers the gain of the operational amplifier 1102 to the value of the low power consumption state.

The control circuit 115 of the IC chip 10 outputs the trigger output signal (TRG_OUT) from the trigger output terminal 103 at the timing of stand-down of the clock signal while data of the (n–k)-th channel is being output. The trigger output signal (TRG_OUT) output from the trigger output terminal 103 is input as the trigger input signal (TRG_IN) to the trigger input terminal 201 of the IC chip 20.

At a timing determined by the trigger input signal (TRG_IN) and the clock signal (CLK) similarly to the timing of the IC chip 10, the IC chip 20 scans and outputs the data after passage of the non-outputting pre-charge time period. In a similar manner, the IC chips 30, 40 also perform sequential scanning and outputting after passage of the non-outputting pre-charge time period.

In this manner, each of the IC chips 10, 20, 30, and 40 is set to the operating state only during the time period of scanning and outputting data and the non-outputting pre-charge time period. Further, the output switch 114 is closed, and the output terminals 131, 231, 331, 431 of each of the IC chips 10, 20, 30, and 40 are set to the outputting state only during the time period of scanning and outputting data after the non-outputting pre-charge time period. At other time periods, each of the IC chips 10, 20, 30, and 40 is set to the low power consumption state.

According to the present embodiment as described above, in the operating sequence of the channel amplifier 111 that amplifies the sensor signal output from each of the sensor elements, the sensor reader 1 is provided with a fixed non-outputting pre-charge time period prior to entering the outputting state after the non-outputting state of data. Further, the control circuit 115 is determined to cause the output of data after, in the non-outputting pre-charge time period, the bias currents of the operational amplifiers 1101, 1102 and the gain of the operational amplifier 1102 are set to the setting values of the operating state and allow convergence of the circuits. Transfer is possible to a stable data-outputting state even when the cutoff frequency of the channel amplifier 111 is low relative to the clock frequency.

Embodiment 3

Figure 9:
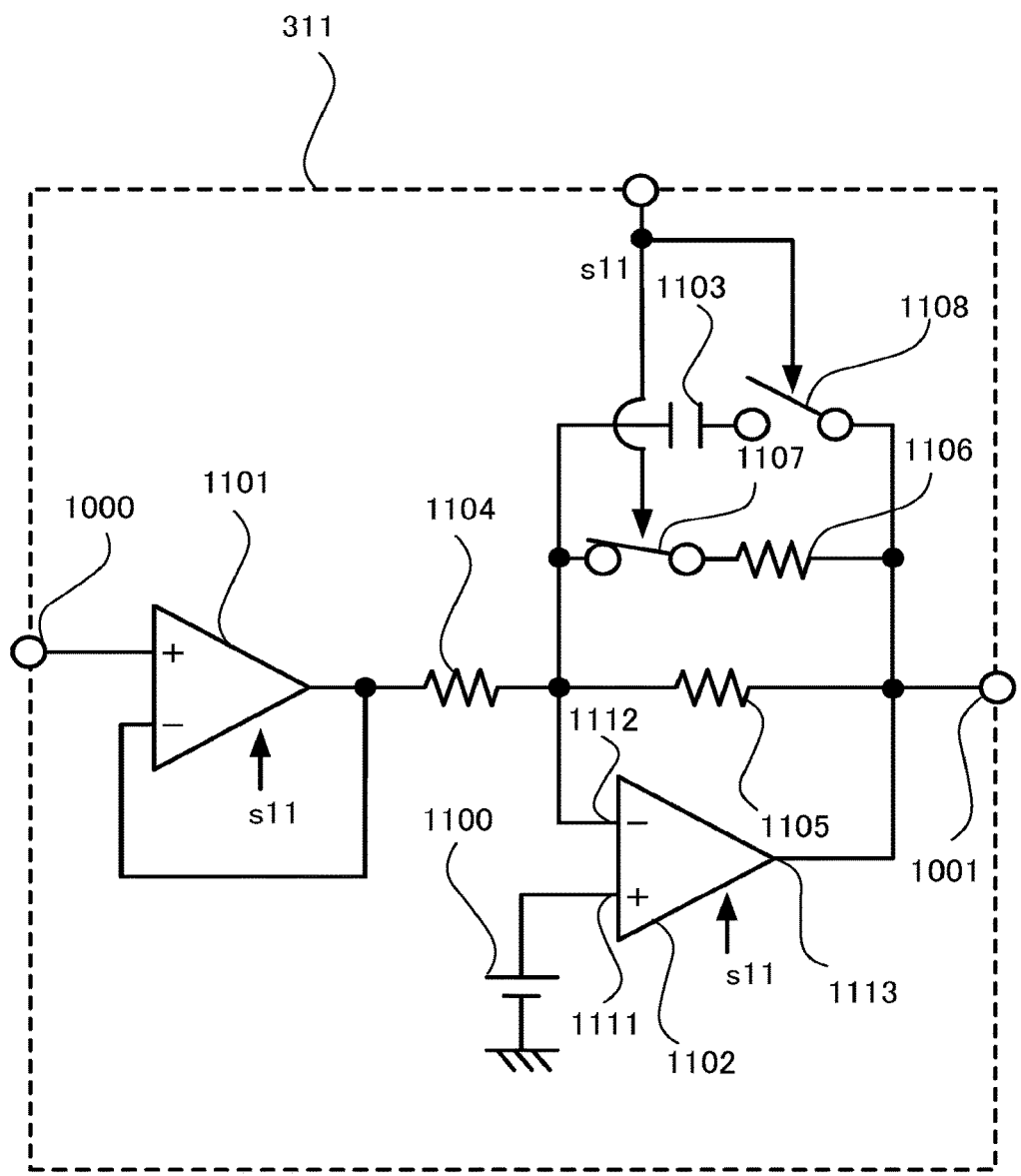
FIG. 9 is a drawing illustrating a circuit configuration of a channel amplifier according to Embodiment 3.

The configuration of the sensor reader 1 in Embodiment 3 of the present disclosure is similar to that of Embodiment 1. Further, the operating sequence of data output timing and the like of the sensor reader 1 are similar to those of the Embodiments 1 and 2. In place of the channel amplifier 111 included in the IC chips 10, 20, 30, and 40 of Embodiments 1 and 2, a channel amplifier 311 is provided as illustrated in FIG. 9. FIG. 9 is a drawing illustrating circuit configuration of the channel amplifier 311.

The channel amplifier 311 according to the present embodiment, in addition to the configuration of the channel amplifier 111 according to Embodiments 1 and 2, has a switch 1108 inserted in series with the capacitor 1103. In a manner similar to that of the switch 1107, the switch 1108 operates on the basis of the control signal s11 input from the control circuit 115, closes when the channel amplifier 311 is in the operating state, and opens during the low power consumption state.

That is to say, in the case of operation by an operating sequence similar to that of Embodiment 1, the switch 1108 closes in the data outputting state, and opens in the non-outputting state. In the case of operation by an operating sequence similar to that of Embodiment 2, the switch 1108 closes in the non-outputting pre-charge state and in the data outputting state, and opens at other time periods.

In this manner, by cutting of the connection to the capacitor 1103 in the low power consumption state, without charging of the capacitor 1103, the output offset ΔVo of the channel amplifier 111 of the low power consumption state can maintain conditions of the output of the operating state. Thus no time is required for restoration of the output of the channel amplifier 111 when there is a switch from the low power consumption state to the operating state. Thus the cutoff frequency can be raised, and operation can be realized at further high speed. Further, in the case of operation by an operating sequence similar to that of Embodiment 2, the non-outputting pre-charge time period can be set to a shorter period, and power consumption can be further lowered.

According to the present embodiment as described above, a configuration of the sensor reader 1 is adopted that inserts the series-connected capacitor 1103 and switch 1108 between the inputs and outputs of the inverting amplifier included in the channel amplifier 311 provided in the IC chips 10, 20, 30, and 40, and that makes the switch 1108 open in the low power consumption state. By this means, transfer is possible to a stable data-outputting state even when the IC chips 10, 20, 30, and 40 are operated at even higher speed.

Embodiment 4

Figure 10:
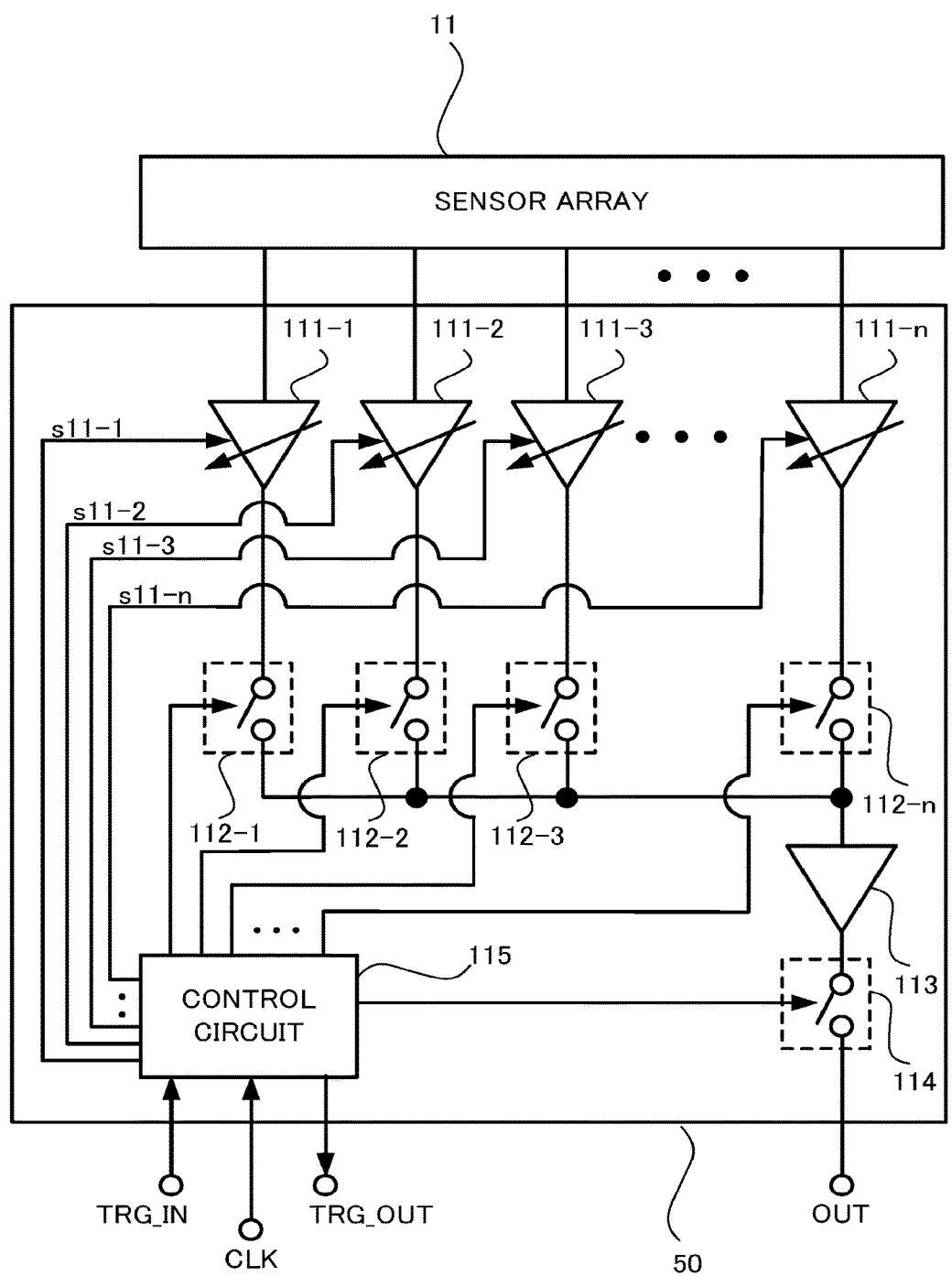
FIG. 10 is a drawing illustrating an internal configuration of an IC chip according to Embodiment 4.
Figure 11:
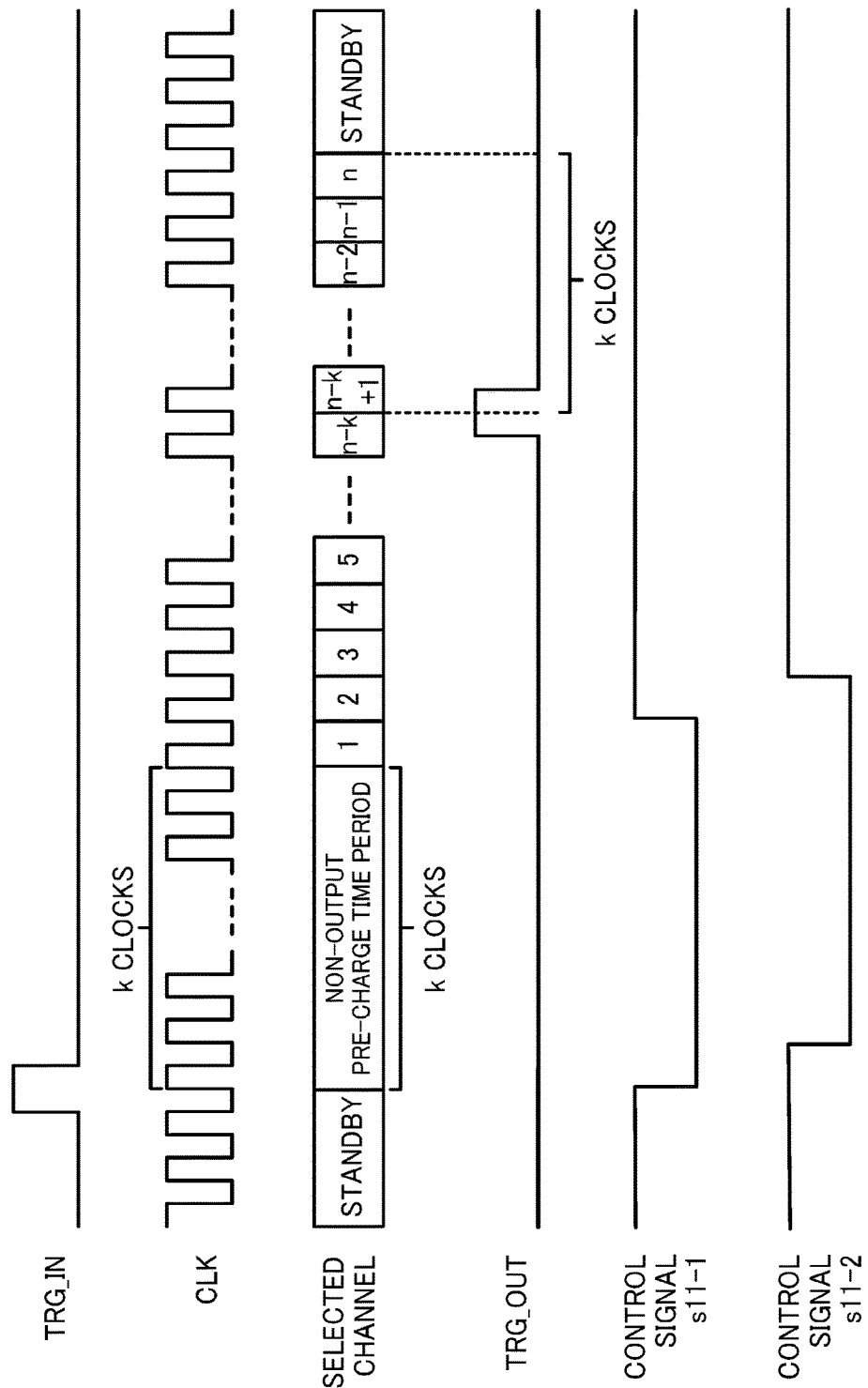
FIG. 11 is a timing chart of the IC chip according to Embodiment 4.

The configuration of the sensor reader 1 of Embodiment 4 of the present disclosure is similar to the configuration of Embodiment 1. In place of the IC chips 10, 20, 30, and 40 of the Embodiments 1 to 3, an IC chip 50 as illustrated in FIG. 10 is provided. FIG. 10 is a drawing illustrating an internal configuration of the IC chip 50. Further, FIG. 11 is a timing chart of the IC chip 50.

In the IC chip 50 according to the present embodiment, control signals s11-1-n are input from the control circuit 115 to the channel amplifiers 111-1-n, respectively. Level of the control signal s11-k, where k is an integer from 1 to n, becomes low at a timing that is earlier by a predetermined time than a timing of closing of a channel switch 112-k, and the level becomes high at a timing of opening of the channel switch 112-k.

That is to say, the channel amplifier 111-k receiving the control signal s11-k sets the values of the gain and the bias currents of the operational amplifiers 1101, 1102 to the setting values of the operating state after the timing that is earlier by the predetermined time than the timing of switching of the channel switch 112-k from open to closed. Further, after the timing of switching of the channel switch 112-k from closed to open, the values of the gain and the bias currents of the operational amplifiers 1101, 1102 are set to the values of the low power consumption state. By this means, the timings of the transitions between the operating state and the low power consumption state of each of the channel amplifiers 111-1-n are shifted channel-by-channel.

According to the present embodiment as described above, the channel amplifier 111 is set to the operating state after the timing that is earlier by a predetermined time period than the timing of closing each of the channel switches 112 of the IC chip 50 included in the sensor reader 1, and the channel amplifier 111 is set to the low power consumption state after the timing of opening of the channel switch 112. The time period in which each channel amplifier 111 is set to the low power consumption state is extended by this means, and thus power consumption can be further reduced.

According to the present disclosure in the above manner, each of the plurality of first amplifiers amplifies the sensor signal input from each of the plurality of sensor elements, the first switch connected to the output of the first amplifier is closed and opened, and the sensor amplification signal output from the first amplifier via the first switch is closed or opened by switching of the second switch. Further, control is determined so as to cause, when the second switch is closed, operating of the first switch so that the sensor amplification signals are output one-by-one sequentially from the first amplifiers; and when the second switch is open, for at least one of the first amplifiers, setting the bias current and the gain to the second setting values that are lower than the first setting values that are the values for when the second switch is closed. Such control enables realization of the reduction of power consumption of the semiconductor integrated circuit, without the decrease of operating speed.

Further, the present disclosure is not limited to the above described embodiments, and naturally various types of modifications are possible within a scope that does not depart from the gist of the present disclosure.

Figure 12:
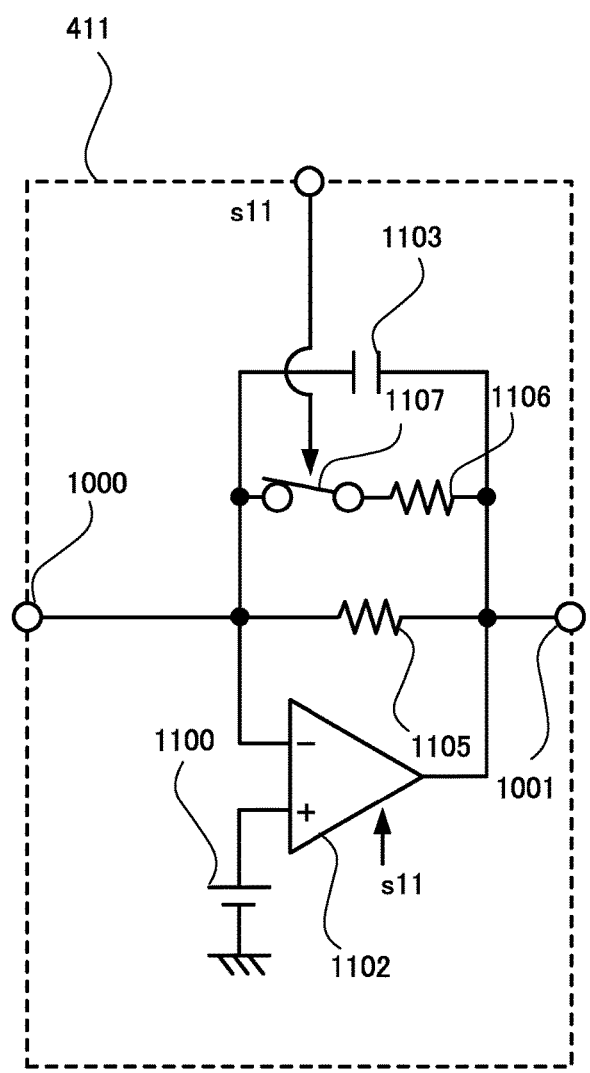
FIG. 12 is a drawing illustrating a circuit configuration of a channel amplifier according to another embodiment.
Figure 13:
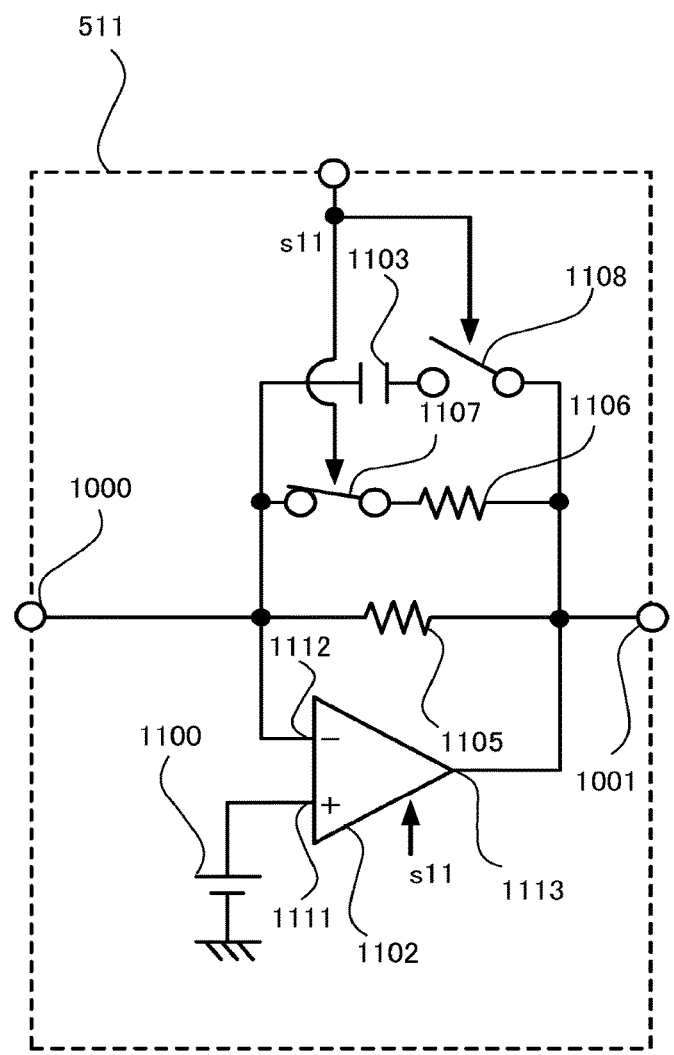
FIG. 13 is a drawing illustrating a circuit configuration of a channel amplifier according to yet another embodiment.

For example, in the above embodiments, the channel amplifier 111 has a voltage amplification-type configuration that interconnects: the voltage-follower amplifier that includes the operational amplifier 1101, and the inverting amplifier that includes the post-stage resistance 1104 and operational amplifier 1102. However, other configurations may be used. FIG. 12 is a drawing illustrating a circuit configuration of a channel amplifier 411 of another embodiment, and FIG. 13 is a drawing illustrating a circuit configuration of a channel amplifier 511 of yet another embodiment. For example, the transimpedance-type channel amplifier 411, such as that illustrated in FIG. 12, may be used in place of the channel amplifier 111 of Embodiments 1 and 2. Further, the transimpedance-type channel amplifier 511, such as that illustrated in FIG. 13, may be used in place of the channel amplifier 311 of Embodiment 3.

Further, although the setting to the low power consumption state in the Embodiments 1 to 3 occurs for all the channel amplifiers 111, 311, and 411 when the output switch 114 is in the non-outputting state, the setting may occur for a portion of the channel amplifiers.

Further, when the output switch 114 is in the non-outputting state, the bias current and gain of the output amp 113 may be decreased from the setting values of the operating state to the setting values of the low power consumption state. Further, the cutoff frequency may be raised by disconnecting the capacitance of the capacitor inserted between the input and output of the output amplifier 113 in the low power consumption state.

Further, although a magnetic sensor is used to detect magnetic information as the sensor element including the sensor array 11, 21, 31, and 41, the sensor may be any type of sensor that detects other freely-selected information. For example, the sensor may be an optical sensor, a pressure sensor, and the like.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Sensor reader
10, 20, 30, and 40, 50 IC chip
11, 21, 31, and 41 Sensor array
101, 201, 301, 401 Trigger input terminal
102, 202, 302, 402 Clock input terminal
103, 203, 303, 403 Trigger output terminal
111, 111-1-n, 311, 411, 511 Channel amplifier
112, 112-1-n Channel switch
113 Output amplifier
114 Output switch
115 Control circuit
131, 231, 331, 431 Signal output terminal
1000 Input terminal
1001 Output terminal
1101, 1102 Operational amplifier
1104, 1105, 1106 Resistance
1103 Capacitor
1107, 1108 Switch
1100 Voltage source
1111 Non-inverted input terminal
1112 Inverted input terminal
1113 Output terminal
1121, 1122 Transistor
1123 Bias source

The invention claimed is:

1. A semiconductor integrated circuit comprising:
a plurality of first amplifiers, each first amplifier of the plurality of first amplifiers amplifying a sensor signal input from a corresponding sensor element of a plurality of sensor elements;
a plurality of first switches, each first switch of the plurality of first switches connecting to an output of a first amplifier to perform switching between conducting and blocking of the output;
a second switch to perform switching of a sensor amplification signal output via a first switch from the first amplifier, the switching of the second switch being between closing to conduct to, and opening to block, an external output terminal; and
a control circuit to cause:
when the second switch is closed, operating of the first switches so that sensor amplification signals output from the plurality of first amplifiers are output sequentially one at a time; and when the second switch is open, setting a bias current and a gain of at least one first amplifier of the plurality of first amplifiers to second setting values that are lower than first setting values, the first setting values being the bias current and the gain when the second switch is closed.

2. The semiconductor integrated circuit according to claim 1, wherein the control circuit causes, at a timing that is a predetermined time prior to switching of the second switch from blocking to conducting, increasing of the bias current and the gain of the first amplifier that are previously lowered to the second setting values, and setting of the bias current and the gain to the first setting values.

3. The semiconductor integrated circuit according to claim 1, wherein the control circuit causes, at a timing that is a predetermined time prior to switching of each of the first switches from blocking to conducting, increasing of the bias current and the gain of the first amplifier connected to the first switch that are previously lowered to the second setting values, and setting of the bias current and the gain to the first setting values.

4. The semiconductor integrated circuit according to claim 1, wherein the control circuit causes raising of a cutoff frequency of the first amplifier when the bias current and the gain of the first amplifier are lowered to the second setting values.

5. The semiconductor integrated circuit according to claim 4, wherein the first amplifier comprises a first operational amplifier, a second operational amplifier, and a first resistance inserted between a first output terminal of the first operational amplifier and a second inverted input terminal of the second operational amplifier;

a signal output from the corresponding sensor element is inputted to a first non-inverted terminal of the first operational amplifier, and a first inverted input terminal is shorted with the first output terminal of the first operational amplifier;

a first voltage source is connected to a second non-inverted input terminal of the second operational amplifier, a second resistance is inserted between the second inverted input terminal and a second output terminal of the second operational amplifier, a third resistance and a third switch are connected in series with each other and are together connected in parallel with the second resistance, and a first capacitor and a fourth switch are connected in series with each other and are together connected in parallel with the second resistance; and the gain of the first amplifier is lowered to that of the second setting values by switching the third switch to conducting; and the first amplifier, when the bias current and the gain are lowered to the second setting value, raises the cutoff frequency of the first amplifier by opening the fourth switch.

6. The semiconductor integrated circuit according to claim 4, wherein the first amplifier further comprises:

a second operational amplifier in which an inverted input terminal receives as input a signal output from the corresponding sensor element, a non-inverted input terminal connects to a first voltage source, a second resistance is inserted between the inverted input terminal and an output terminal, a third resistance and a third switch are connected in series with each other and are together connected in parallel with the second resistance, and a first capacitor and a fourth switch are connected in series with each other and are together connected in parallel to the second resistance;

the gain of the first amplifier is lowered to that of the second setting values by closing the third switch; and the first amplifier, when the bias current and the gain are lowered to the second setting values, raises the cutoff frequency of the first amplifier by opening the fourth switch.

7. The semiconductor integrated circuit according to claim 1, further comprising:

a second amplifier to amplify the sensor amplification signal output via the first switch from one of the plurality of first amplifiers; wherein the second switch is connected to an output of the second amplifier, and switches between conducting and blocking relative to the external output terminal; and the control circuit causes setting of a bias current and a gain of the second amplifier to fourth setting values that are lower than third setting values, the third setting values being used when the second switch is closed, and the fourth setting values being used when the second switch is open.

8. The semiconductor integrated circuit according to claim 7, wherein the control circuit causes raising of a cutoff frequency of the second amplifier when the bias current and the gain of the second amplifier are lowered to the fourth setting values.

9. The semiconductor integrated circuit according to claim 8, wherein the first amplifier comprises a first operational amplifier, a second operational amplifier, and a first resistance inserted between a first output terminal of the first operational amplifier and a second inverted input terminal of the second operational amplifier;

a signal output from the corresponding sensor element is inputted to a first non-inverted input terminal of the first operational amplifier, and a first inverted input terminal is shorted with the first output terminal of the first operational amplifier;

a first voltage source is connected to a second non-inverted input terminal of the second operational amplifier, a second resistance is inserted between the second inverted input terminal and a second output terminal of the second operational amplifier, a first capacitor is connected in parallel to the second resistance, and a third resistance and a third switch connected in series with each other are together connected in parallel to the second resistance; and the gain of the first amplifier is lowered to the gain of the second setting values by closing of the third switch.

10. The semiconductor integrated circuit according to claim 8, wherein the first amplifier comprises:

a second operational amplifier in which an inverted input terminal receives as input a signal output from the corresponding sensor element, a non-inverted input terminal connects to a first voltage source, a second resistance is inserted between the inverted input terminal and an output terminal, a first capacitor is connected in parallel with the second resistance, and a third resistance and a third switch are connected in series with each other and are together connected in parallel to the second resistance, wherein the gain of the first amplifier is lowered to the gain of the second setting values by closing the third switch.

11. The semiconductor integrated circuit according to claim 1, wherein
the first amplifier comprises a first operational amplifier, a second operational amplifier, and a first resistance inserted between a first output terminal of the first operational amplifier and a second inverted input terminal of the second operational amplifier;
a signal output from the corresponding sensor element is inputted to a first non-inverted input terminal of the first operational amplifier, and a first inverted input terminal is shorted with the first output terminal of the first operational amplifier;
a first voltage source is connected to a second non-inverted input terminal of the second operational amplifier, a second resistance is inserted between the second inverted input terminal and a second output terminal of the second operational amplifier, a first capacitor is connected in parallel to the second resistance, and a third resistance and a third switch connected in series with each other are together connected in parallel to the second resistance; and
the gain of the first amplifier is lowered to the gain of the second setting values by closing of the third switch.

12. The semiconductor integrated circuit according to claim 1, wherein the first amplifier comprises:
a second operational amplifier in which an inverted input terminal receives as input a signal output from the corresponding sensor element, a non-inverted input terminal connects to a first voltage source, a second resistance is inserted between the inverted input terminal and an output terminal, a first capacitor is connected in parallel with the second resistance, and a third resistance and a third switch are connected in series with each other and are together connected in parallel to the second resistance, wherein
the gain of the first amplifier is lowered to the gain of the second setting values by closing the third switch.

13. A sensor reader comprising:
at least two sensor arrays, each sensor array comprising the plurality of sensor elements; and
at least two semiconductor integrated circuits, each semiconductor integrated circuit according to claim 1 to sequentially output the sensor amplification signals amplifying the sensor signals input from the plurality of sensor elements included in the sensor array.

14. The sensor reader according to claim 13, comprising:
two of the semiconductor integrated circuits as a first semiconductor integrated circuit and a second semiconductor integrated circuit, wherein
the first semiconductor integrated circuit closes the second switch at a timing of a clock signal upon or after input of a first trigger signal, operates the first switch and outputs sequentially the sensor amplification signals and outputs a second trigger signal to the second semiconductor integrated circuit when output of the sensor amplification signals is completed; and
the second semiconductor integrated circuit closes the second switch at a timing of a clock signal upon or after input of the second trigger signal, and operates the first switch and outputs sequentially the sensor amplification signals.

15. The sensor reader according to claim 13, wherein the control circuit of the semiconductor integrated circuit causes:
raising of the bias current and the gain of the first amplifier, that were previously lowered to the second setting values, to the first setting values at a timing of input of a trigger signal;
closing the second switch after at least a predetermined number of clocks upon or after input of the trigger signal; and
closing sequentially the first switches to output the sensor amplification signals.

16. A sensor readout method, comprising:
an amplifying step of amplifying, by a plurality of amplifiers, sensor signals input from a plurality of sensor elements;
a signal switching step of, for each of a plurality of first switches connected to a corresponding amplifier of the plurality of amplifiers, opening a first switch to block connection, and closing the first switch to make connection, for sequential output of sensor amplification signals amplified in the amplifying step;
an output switching step of opening a second switch to block transmission, and closing the second switch to allow transmission, of the sensor amplification signals output via the first switch to an external output terminal; and
an amplifier setting change step of, when transmission is blocked in the output switching step, setting a bias current and a gain of at least one of the amplifiers to second setting values that are lower than first setting values, the first setting values being used when transmission is allowed to the external output terminal.

* * * * *